(12) United States Patent
Moh et al.

(10) Patent No.: US 11,065,642 B2
(45) Date of Patent: Jul. 20, 2021

(54) MULTICOLOR FIXTURE FINISHES

(71) Applicant: Kohler Co., Kohler, WI (US)

(72) Inventors: Sarfaraz Moh, Kohler, WI (US); Gary N. Clarke, Sheboygan, WI (US)

(73) Assignee: KOHLER CO., Kohler, WI (US)

( * ) Notice: Subject to any disclaimer, the term of this patent is extended or adjusted under 35 U.S.C. 154(b) by 0 days.

(21) Appl. No.: 16/230,546

(22) Filed: Dec. 21, 2018

(65) Prior Publication Data

US 2019/0210062 A1     Jul. 11, 2019

Related U.S. Application Data

(60) Provisional application No. 62/614,385, filed on Jan. 6, 2018.

(51) Int. Cl.
*B05D 5/06* (2006.01)
*C23C 14/00* (2006.01)
(Continued)

(52) U.S. Cl.
CPC .............. *B05D 5/066* (2013.01); *B05D 1/327* (2013.01); *B05D 5/068* (2013.01); *C23C 2/006* (2013.01);
(Continued)

(58) Field of Classification Search
CPC ........ B05D 5/068; B05D 5/066; B05D 1/327; C23C 4/02; C23C 16/042; C23C 4/01; C23C 2/006; C23C 16/06; C23C 14/16; C23C 24/08; C23C 30/00; C23C 4/06; C23C 2/02; C23C 28/023; C23C 14/5873; C23C 24/04; C23C 28/02; C23C 14/044; C23C 28/028; C23C 2/04; C23C 4/18; C23C 28/021; C23C 4/08; C23C 14/0623;
(Continued)

(56) References Cited

U.S. PATENT DOCUMENTS

| 3,474,008 A | 10/1969 | Buisman |
| 3,707,445 A | 12/1972 | Green |

(Continued)

FOREIGN PATENT DOCUMENTS

| EP | 2050581 A2 | 4/2009 |
| JP | H03240942 A | 10/1991 |

OTHER PUBLICATIONS

Extended European Search Report in EP Patent Application No. 19150244.2 dated Jun. 4, 2019; 7 pgs.

*Primary Examiner* — Dah-Wei D. Yuan
*Assistant Examiner* — Nga Leung V Law
(74) *Attorney, Agent, or Firm* — Foley & Lardner LLP

(57) ABSTRACT

A method of applying a multi-color finish to a plumbing fixture includes depositing a first coating on the plumbing fixture; selectively applying a masking material in a graduated fashion over at least a portion of the first coating to define a gradient from a first portion of the plumbing fixture that is substantially completely covered by the masking material to a second portion of the plumbing fixture that has substantially no masking material; depositing a second coating over the masking material; and removing the masking material from the plumbing fixture such that the plumbing fixture has a surface finish including a transition region representing a gradual transition between the first coating and the second coating.

19 Claims, 6 Drawing Sheets

(51) Int. Cl.
| | |
|---|---|
| C23C 16/00 | (2006.01) |
| C23C 16/04 | (2006.01) |
| C23C 2/00 | (2006.01) |
| C23C 4/02 | (2006.01) |
| C23C 4/01 | (2016.01) |
| C23C 16/06 | (2006.01) |
| C23C 14/16 | (2006.01) |
| C23C 24/08 | (2006.01) |
| C23C 4/06 | (2016.01) |
| C23C 2/02 | (2006.01) |
| C23C 28/02 | (2006.01) |
| C23C 14/58 | (2006.01) |
| C23C 24/04 | (2006.01) |
| C23C 14/04 | (2006.01) |
| C25D 5/02 | (2006.01) |
| C23C 30/00 | (2006.01) |
| C25D 5/10 | (2006.01) |
| C25D 7/00 | (2006.01) |
| C23C 2/04 | (2006.01) |
| C23C 4/18 | (2006.01) |
| C23C 4/08 | (2016.01) |
| B05D 1/32 | (2006.01) |
| C23C 14/06 | (2006.01) |
| B44C 1/00 | (2006.01) |
| E03C 1/04 | (2006.01) |

(52) U.S. Cl.
CPC .................. *C23C 2/02* (2013.01); *C23C 2/04* (2013.01); *C23C 4/01* (2016.01); *C23C 4/02* (2013.01); *C23C 4/06* (2013.01); *C23C 4/08* (2013.01); *C23C 4/18* (2013.01); *C23C 14/0015* (2013.01); *C23C 14/044* (2013.01); *C23C 14/0623* (2013.01); *C23C 14/0647* (2013.01); *C23C 14/16* (2013.01); *C23C 14/165* (2013.01); *C23C 14/5873* (2013.01); *C23C 16/006* (2013.01); *C23C 16/042* (2013.01); *C23C 16/06* (2013.01); *C23C 24/04* (2013.01); *C23C 24/08* (2013.01); *C23C 28/02* (2013.01); *C23C 28/021* (2013.01); *C23C 28/023* (2013.01); *C23C 28/028* (2013.01); *C23C 30/00* (2013.01); *C25D 5/022* (2013.01); *C25D 5/10* (2013.01); *C25D 7/00* (2013.01); *B44C 1/00* (2013.01); *E03C 1/0404* (2013.01)

(58) Field of Classification Search
CPC .............. C23C 14/0647; C23C 14/165; C23C 14/0015; C23C 16/006; C25D 5/022; C25D 7/00; B44C 1/00; E03C 1/0404
See application file for complete search history.

(56) References Cited

U.S. PATENT DOCUMENTS

| | | | |
|---|---|---|---|
| 4,150,472 A | | 4/1979 | Derain |
| 4,758,280 A | | 7/1988 | Bergmann et al. |
| 4,988,424 A | * | 1/1991 | Woodward ............ C23C 14/044 |
| | | | 118/504 |
| 5,403,616 A | * | 4/1995 | Hattori ..................... H05B 3/84 |
| | | | 427/126.3 |
| 5,443,032 A | * | 8/1995 | Vichr ..................... C30B 25/02 |
| | | | 117/84 |
| 6,410,086 B1 | | 6/2002 | Brandon et al. |
| 6,737,148 B1 | | 5/2004 | Smith |
| 2004/0093730 A1 | | 5/2004 | Miya et al. |
| 2004/0101709 A1 | * | 5/2004 | Chen ....................... C23C 28/04 |
| | | | 428/626 |
| 2007/0026205 A1 | * | 2/2007 | Anton ..................... B05D 5/06 |
| | | | 428/195.1 |
| 2010/0159179 A1 | * | 6/2010 | Frost .................. C23C 14/0641 |
| | | | 428/36.92 |
| 2016/0322224 A1 | * | 11/2016 | Wright ..................... C07F 9/72 |

* cited by examiner

MULTICOLOR FIXTURE FINISHES

CROSS-REFERENCE TO RELATED APPLICATIONS

This application claims the benefit of and priority to U.S. Provisional Application No. 62/614,385, filed on Jan. 6, 2018, the entire disclosure of which is hereby incorporated by reference herein.

BACKGROUND

The present application relates to multi-colored finishes for fixtures, and fixtures having such finishes. More specifically, disclosed herein are methods of applying such finishes to achieve a surface appearance that transitions in color, shade, or lightness from one region to another, typically in a graduated fashion.

SUMMARY

At least one embodiment relates to a method of applying a multi-color finish to a plumbing fixture that includes depositing a first coating on the plumbing fixture; selectively applying a masking material in a graduated fashion over at least a portion of the first coating to define a gradient from a first portion of the plumbing fixture that is substantially completely covered by the masking material to a second portion of the plumbing fixture that has substantially no masking material; depositing a second coating over the masking material; and removing the masking material from the plumbing fixture such that the plumbing fixture has a surface finish including a transition region representing a gradual transition between the first coating and the second coating.

In some exemplary embodiments, the transition region includes a first percentage of the first coating and a second percentage of the second coating.

In some exemplary embodiments, the first percentage is in a range of about 5% to about 95% with the remaining balance as the second percentage.

In some exemplary embodiments, the transition region includes a plurality of percentages of the first coating and a plurality of percentages of the second coating.

In some exemplary embodiments, the first coating defines a first finish having a first appearance and the second coating defines a second finish having a second appearance that is different from the first appearance.

In some exemplary embodiments, the first finish and the second finish are selected from at least one of polished chrome, brushed chrome, polished French gold, polished titanium, brushed titanium, polished rose gold, polished modern gold, polished tungsten, polished modern brass, satin titanium, polished satin chrome, satin bronze, polished brass, satin brass, oil-rubbed bronze, polished nickel, brushed nickel, or matte black.

In some exemplary embodiments, the step of depositing the first coating and the step of depositing the second coating are conducted using at least one of physical vapor deposition (PVD), chemical vapor deposition (CVD), atomic layer deposition (ALD), electroplating, dip coating, or spray coating.

In some exemplary embodiments, the step of depositing the first coating and the step of depositing the second coating are each conducted using physical vapor deposition (PVD), and wherein the PVD is conducted as the plumbing fixture is rotated on a turntable.

In some exemplary embodiments, the PVD is selected from at least one of cathodic-arc evaporation, sputter deposition, or high-impulse power magnetron sputtering (HIPIMS).

In some exemplary embodiments, the masking material includes at least one of molybdenum disulfide, tungsten disulfide, boron nitride, or graphite.

In some exemplary embodiments, after the step of masking, the masking material is cured at a temperature in a range of about 60° C. to about 250° C. for a time in a range of about 15 minutes to about 120 minutes.

In some exemplary embodiments, the masking material is applied by a technique selected from the group consisting of printing, powder coating, painting, spraying, dipping, brushing, and dry-powder tumbling.

In some exemplary embodiments, the masking material is applied by spraying, and the spraying is conducted as the plumbing fixture is rotated on a turntable.

In some exemplary embodiments, the step of depositing the second coating comprises depositing the second coating on the first portion and the second portion.

In some exemplary embodiments, the step of removing the masking material comprises washing the plumbing fixture using at least one of a water-based wash, an acid wash, or an organic solvent-based wash.

Another exemplary embodiment relates to a multi-color plumbing fixture including a surface finish. The surface finish includes a first appearance, a second appearance, and a transition region. The first appearance is on a first portion of the plumbing fixture. The second appearance is on a second portion of the plumbing fixture, wherein the second appearance is different from the first appearance. The transition region is disposed between the first portion and the second portion, wherein the transition region represents a gradual transition between the first appearance and the second appearance.

In some exemplary embodiments, the first appearance is defined by a first coating, and wherein the second appearance is defined by a masking material.

In some exemplary embodiments, the first appearance is defined by a first coating having a first finish, and wherein the second appearance is defined by a second coating having a second finish that is different from the first finish.

In some exemplary embodiments, the transition region includes a first percentage of the first coating and a second percentage of the second coating.

In some exemplary embodiments, the transition region includes a plurality of percentages of the first coating and a plurality of percentages of the second coating.

DETAILED DESCRIPTION

Figure 1:
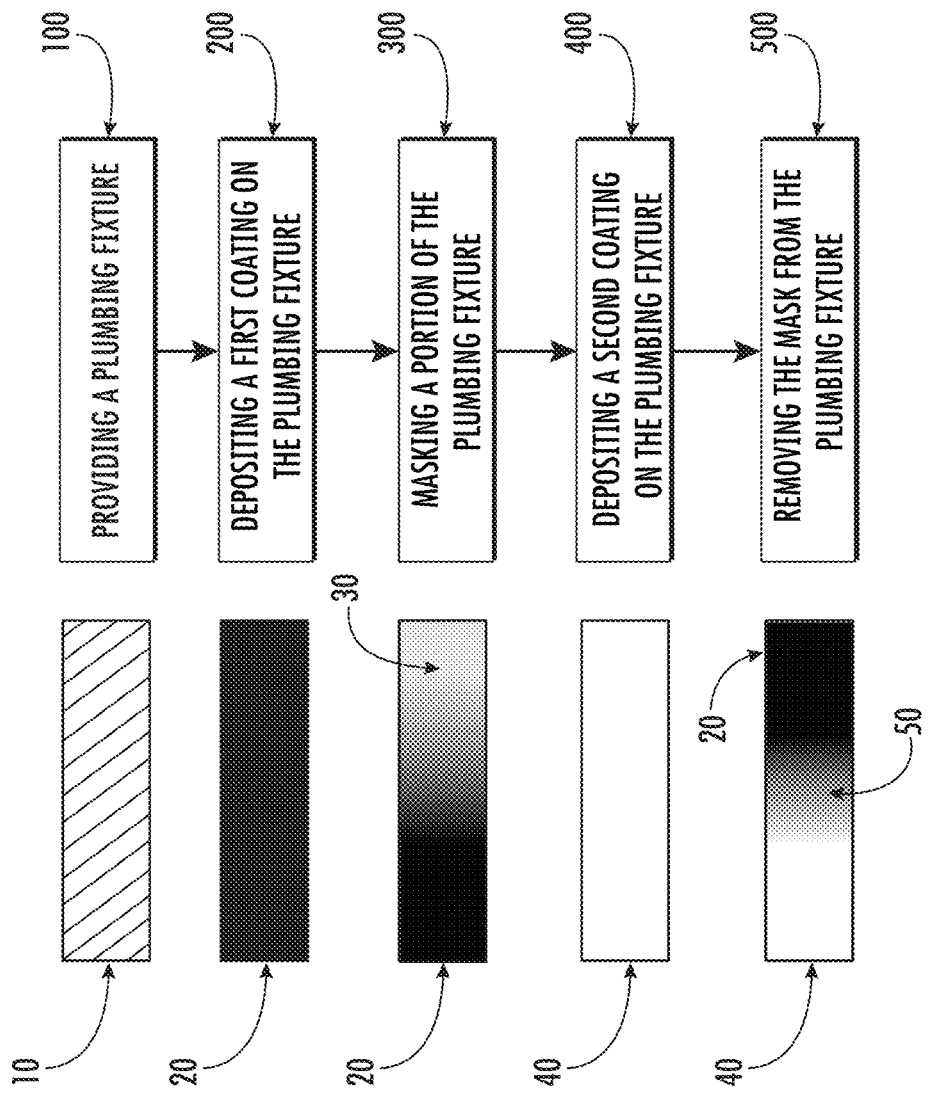
FIG. 1 is a flow diagram illustrating a method of applying a multi-color finish to a fixture according to an exemplary embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

As used in the present disclosure, the term "ombré" may be used to describe a visual effect in which a color, shade, or lightness gradually transitions from one region to another. For example, a color may be graduated from darker to lighter from one region to the next. The actual graduation may be from a darker color to a lighter color, from one shade to another, or to any combination of colors or shades. While ombré effects have been used most frequently in the textile and hair industries, they have not been adapted for use in connection with surfaces having irregular patterns or shapes, and specifically for plumbing fixtures that require a resilient finish that is intended to withstand ordinary usage in such environments.

It would be advantageous to provide a novel method for applying multi-color finishes to fixtures, and to produce products employing such finishes to provide a unique and heretofore unused finish for such products. These and other advantageous features will be apparent to those reviewing the present disclosure.

The present disclosure provides for a method of forming a multicolor finish to a fixture, and fixtures having such finish. Referring to the exemplary embodiment of FIG. 1, a first step 100 of the disclosed process includes providing a fixture, shown as a plumbing fixture 10, as a substrate upon which the multicolor finish will be applied. The plumbing fixture is not meant to be limited and may be any household plumbing fixture associated with delivering and draining water. The plumbing fixture may be at least one of faucets for sinks, tubs, whirlpools, shower heads, spas, soap dispensers, and the like; faucet handles; faucet accessories such as fluid conduits (e.g., water piping, hoses, etc.); or water containers or vessels such as sinks, tubs, whirlpools, spas, etc. In another embodiment, the multicolor finish may also be applied to other fixtures, such as bathroom or kitchen fixtures such as towel holders, lighting fixtures, or ventilation fixtures. Moreover, the surface finish may be applied to a surface of the fixture that is made from at least one of a low-corrosive metal or metal alloys (e.g., tungsten, titanium, chrome, pewter, copper, bronze, brass, stainless steel, zinc alloys), ceramic (e.g., porcelain), glass, plastic, or combinations thereof.

A second step 200 of the process according to the embodiment of FIG. 1 includes depositing a first coating 20 on the plumbing fixture 10 to obtain a first finish having a first appearance. In one embodiment, the step of depositing the first coating includes depositing the first coating on the entire surface area of the plumbing fixture. In another embodiment, only a portion of the surface area of the fixture is coated with the first finish. The first finish may be at least one of a polished metal, brushed metal, gold-plated, oil-rubbed metal, satin metals or combinations thereof. Non-limiting examples of the first finish include polished chrome, brushed chrome, polished French gold, polished titanium, brushed titanium, polished rose gold, polished modern gold, polished tungsten, polished modern brass, satin titanium, polished satin chrome, satin bronze, polished brass, satin brass, oil-rubbed bronze, polished nickel, brushed nickel, matte black, and the like.

The step of depositing the first coating may be conducted using at least one of a vacuum deposition (physical vapor deposition, PVD; chemical vapor deposition, CVD; atomic layer deposition, ALD), electroplating, dip coating, or spray coating process. In one embodiment, PVD is used as the deposition technique for forming the first coating on the plumbing fixture.

PVD vacuum deposition processes are advantageous because they involve no aqueous component and are more environmentally friendly and economical than wet chemical processes. PVD coatings are typically harder and more corrosion-resistant than coatings applied by electroplating. Most PVD coatings have high temperature and good impact strength, excellent abrasion resistance, and are durable such that protective topcoats are optional. PVD deposition processes include at least one of cathodic arc evaporation, electron beam (e-beam) PVD, evaporative deposition, pulsed-laser deposition, sputter deposition, ion plating, or pulsed-electron deposition. In typical PVD processes, a material is vaporized from a solid source and transported in a vacuum environment as a vapor to a substrate where it condenses, forming a coating. The vacuum environment is configured such that the mean free path for collision between particles is on the order of the dimensions of the processing chamber or through a low-pressure environment of gas or plasma (ionized gas).

In some embodiments, the PVD process of the first coating is a reactive deposition process whereby the depositing species reacts with a gas species in the processing environment to form a compound prior to depositing (e.g., nitrogen reacting with depositing titanium to form a coating of TiN (having a gold appearance)). Decorative/wear PVD coatings for plumbing fixtures include TiN (having a gold appearance), ZrN (having a brass-like appearance), TiC (having a black appearance), TICN (having an "anthracite gray" appearance), ZrCN (having a nickel-like appearance), ZrCrN (having a brass-like appearance), and ZrCrN (having a gold or rose-gold appearance). In one embodiment, a thickness of the first coating may vary in a range of about 100 nm to about 2000 nm. In some embodiments, prior to PVD deposition, at least one thin seed or primer layer may be deposited on the plumbing fixture to achieve enhanced bonding characteristics with the subsequently PVD coating. For surfaces that are non-planar, the plumbing fixture may be set on a turntable that manually or automatically rotates as the first coating is applied.

In some embodiments, the vacuum deposition of the first coating is conducted using vacuum evaporation, whereby an evaporation material source is thermally vaporized from a container heated either electrically or by an e-beam. The vaporization is conducted such that the trajectory of the vaporized material is line-of-sight. The vacuum environment reduces contamination from the deposition environment. Typical gas pressures are in a range of $10^{-5}$ Torr to $10^{-6}$ Torr. In other embodiments, the vacuum deposition is conducted using sputter deposition, whereby atoms are removed from a solid "target" of the to-be-deposited material by bombardment with accelerated ions. Momentum transfer causes ejection of surface atoms, which are then deposited onto the substrate. Sputtering occurs at less than $5\times10^{-3}$ Torr where particles do not suffer from collisions with gas molecules in the volume between the target and substrate. Sputter deposition includes diode, magnetron and ion beam sputtering.

In yet other embodiments, the vacuum deposition is conducted using high-impulse power magnetron sputtering (HIPIMS), whereby short pulses of high power are applied to the target on the order of kW/cm$^2$. At these power levels, ionization of the sputtered material creates a metal-based plasma. Coatings made by HIPIMS are very dense and smooth in character. In yet other embodiments, the vacuum deposition is conducted using ion plating using energetic ion bombardment during deposition to densify the deposit and control properties of the coating such as stress and microstructure. Ion bombardment during deposition is conducted by accelerating ions from a plasma directly to the solid material source or by using a separate ion source (e.g., "ion gun").

A third step 300 of the process according to the embodiment of FIG. 1 includes masking 30 a portion of the plumbing fixture 10. In general, the step of masking is conducted to selectively protect a portion of the plumbing fixture 10 that already comprises the first coating 20. The masking 30 may define a second appearance of the plumbing fixture 10 that is different from the first appearance of the first coating. In a subsequent deposition process (i.e., step 400 of FIG. 1), a second coating is deposited directly on both the protected and unprotected portions of the plumbing fixture to define a second finish having a second appearance different from the first appearance. Therefore, selection of the mask material is based on its ability to selectively separate in a post-deposition wash (i.e., step 500 of FIG. 1), carrying with it the portion of the second coating deposited on the mask while leaving the portion of the first coating deposited underneath the mask intact. Moreover, another factor in selecting the mask material is its outgassing properties. Similar to the methods of forming the first coating, in some embodiments, the second coating is also deposited in a vacuum environment. In vacuum environments, one common problem is the release of gas from the bulk of a material positioned in the vacuum chamber. This outgassing adds to the pressure load in the chamber and affects film deposition rates and introduces contamination into the deposited film. For example, for masking materials having a high outgassing rate would potentially result in contamination of the second coating with outgassed elements (adversely affecting the aesthetics of the resultant film), as well as reduce deposition rates of the second coating due to decreased mean free path for collision between the depositing material and other gaseous particles between the target and substrate. Therefore, to minimize contamination and reduce deposition rates of the second coating, Applicant advantageously utilized a masking material having a low outgassing rate.

Vacuum-compatible masking materials may be selected from at least one of metals, plastics, glasses, ceramics, lubricants, or adhesives. Non-limiting examples of metal masks include: austenitic stainless steels, mild steels, aluminum and aluminum alloys, aluminum bronze, nickel and nickel alloys, beryllium, oxygen-free copper, indium, gold, platinum, zirconium, titanium, tungsten, molybdenum, tantalum, niobium, and solders (e.g., tin-silver eutectic (95% Sn, 5% Ag)). Non-limiting examples of plastic masks include: fluoropolymers (e.g., polyvinylidene fluoride, polytetrafluoroethylene), vespel polyimide, polycarbonates, polystyrene, polyetheretherketone (PEEK), Kapton, and elastomers (e.g., nitrile rubber, fluorinated elastomers, perfluoroelastomeric compounds). Non-limiting examples of glasses and ceramics include: borosilicate glass, alumina ceramics, and fluorphlogopite mica in borosilicate glass matrices. Non-limiting examples of lubricants include vacuum greases (e.g., Ramsey grease, fluorether-based greases, polyphenyl ether greases) and dry lubricants (e.g., molybdenum disulfide, tungsten disulfide, boron nitride, graphite), which are materials that, despite being in the solid phase, effectively reduces friction between two in-contact surfaces without needing a liquid oil medium. In one embodiment, the vacuum-compatible masking material is a mixture comprising boron nitride.

In one embodiment, the vacuum-compatible masking material is a dry lubricant fabricated by a method selected from the group consisting of printing, powder coating, painting, spraying, dipping, brushing, and dry-powder tumbling. For example, a dry lubricant material is initially dispersed as an additive in a solvent such as an organic solvent, water, or grease. The substrate (e.g., plumbing fixture) may then be selectively spray-coated with the additive-containing solvent and then allowed to cure until the solvent evaporates, leaving behind a solid, dry lubricant. In one embodiment, a thickness of the masking material may greater than the thickness of either the first coating or second coating, for example, in a range of about 10 μm to about 100 μm. In one embodiment where boron nitride is used as the masking material, the curing is conducted at a range of about 60° C. to about 250° C. (e.g., 80° C.) for a time in a range of about 15 minutes to about 120 minutes (e.g., 20 minutes) for each layer.

Figure 2:
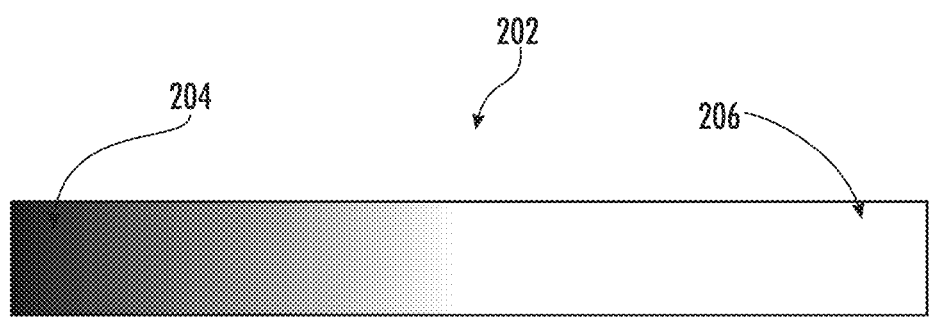
FIG. 2 illustrates a plumbing fixture including a masking material and a first coating according to an exemplary embodiment.
Figure 3:
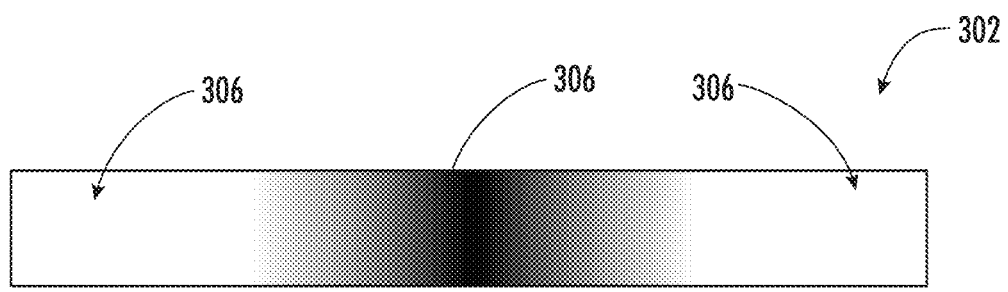
FIG. 3 is illustrates a plumbing fixture including a masking material and a first coating according to another exemplary embodiment.

For surfaces that are non-planar, the plumbing fixture may be set on a turntable that manually or automatically rotates 360° as the masking material is applied. The material is sprayed in any desired predetermined pattern, but in a graduated fashion to define a gradient. For example, as seen in the embodiment of FIG. 2, one end of the plumbing fixture 202 may be substantially completely (i.e., about 100%) covered with the masking material 204 with a gradient forming as the spray coating is applied further and further away from the 100%-coated end until the fixture 202 has substantially no (i.e., about 0%) mask applied over the first coating 206 (i.e., the first coating is mostly visible). In another exemplary embodiment shown in FIG. 3, a middle portion of the plumbing fixture 302 is substantially completely covered with the masking material 304 with a gradient forming as the spray coating is applied further and further away in each direction from the substantially 100%-coated middle portion until the fixture 302 has substantially no mask applied over the first coating 306. It should be noted that any desired pattern for the masking material may be employed according to various exemplary embodiments.

Figure 5:
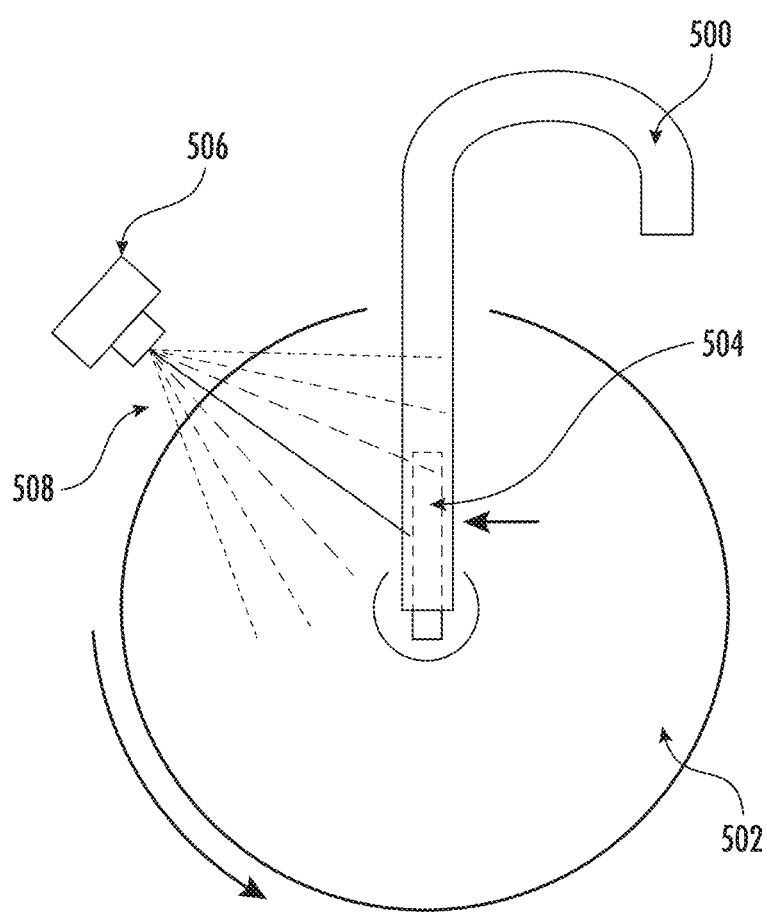
FIG. 5 illustrates a process for masking a portion of a plumbing fixture, according to an exemplary embodiment.

FIG. 5 illustrates a process for masking a portion of the plumbing fixture, according to an exemplary embodiment. A plumbing fixture 500 is positioned atop a rotatable turntable 502 and temporarily affixed to a centrally located rod 504 extending upwards from a top surface of the turntable. The fixture 500 may be affixed to the rod 504 using any fastening arrangement, such as a clip, pin, adhesive, etc., such that when rotated, the fixture remains secure to achieve a predetermined patterning of the masking material 508, which is sprayed using a spray gun 506 (e.g., a pressurized container, etc.). The rod 504 may be modified depending on the type of fixture upon which the masking material 508 is being deposited. For example, an extension length and/or width of the rod may be altered depending on the dimensions of the fixture to maximize stability of the fixture while rotated.

In some exemplary embodiments, the spray gun 506 is manually held by a user applying the masking material 508. In other exemplary embodiments, the spray gun 506 is held by a robotic arm as the turntable 502 rotates. The turntable rotates at predetermined revolutions per minute in a range of about 5 rpm to about 15 rpm. In one example, the turntable may rotate at about 10 rpm. The spray gun 506, whether held manually or by robotic arm, is positioned at a distance in a range of about 6 inches to about 24 inches away from the rotating fixture. In one example, the spray gun may be held at a distance of about 12 inches away from the rotating fixture. It is also contemplated that the spray gun 506, whether held manually or by robotic arm, is rotated around the fixture 500, with the fixture being stationary. As the masking material 508 is sprayed onto the fixture target, the intensity of the spray stream varies along the angle at which it exits the spray gun 506. In other words, the portion of the fixture 500 which experiences the center of the spray stream will have a greater density of masking material coated thereon (i.e., more complete coverage) than will the portion of the fixture 500 which experiences an edge of the spray stream (i.e., less complete coverage). FIG. 5 depicts this phenomena using the dashed lines for the masking material 508 exiting the spray gun 506.

The spray gun 506 may be moved linearly up and down along a length of the fixture to achieve the desired coverage such that below a certain length of the fixture (e.g., below a position 'a') to where the fixture meets a top surface of the turntable 502, there is substantially complete (e.g., about 100%) coverage of the masking material on the fixture. Above the position 'a' is the portion of the fixture, which has a gradient of masking material coated thereon. Rotation is continued until a predetermined masking material pattern is achieved.

A fourth step 400 of the process according to the embodiment of FIG. 1 includes depositing a second coating 40 on the plumbing fixture 10 atop both the protected portion coated with the masking material 30 and the unprotected portion coated by only the first coating 20. In one embodiment, a thickness of the second coating may vary in a range of about 100 nm to about 2000 nm. As described above, the second coating may be deposited using a deposition technique, which is the same as or different from the deposition technique used for fabricating the first coating.

A fifth step 500 of the process according to the embodiment of FIG. 1 includes removing the mask 30 from the plumbing fixture 10 to achieve a final ombré appearance (i.e., a dual-coated, graded appearance) whereby the fixture 10 comprises the first coating 20 having a first appearance, the second coating 40 having a second appearance different from the first appearance, and a transition region 50 representing the gradual transition of the first coating 20 to the second coating 40, or vice-versa. In one exemplary embodiment, the transition region 50 includes a first percentage of the first coating and a second percentage of the second coating. The first percentage is in the range of about 5% to about 95%, with the remaining balance as the second percentage. In one exemplary embodiment, the transition region 50 includes a plurality of percentages of the first coating and a plurality of percentages of the second coating.

Figure 4:
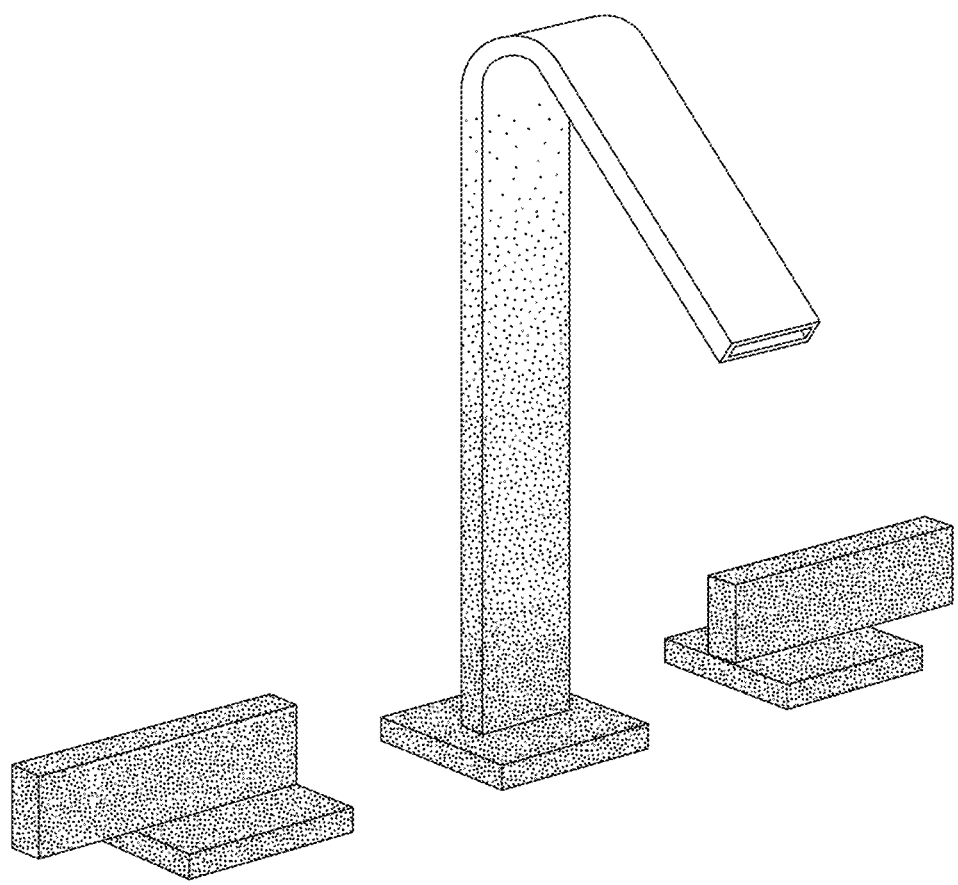
FIG. 4 illustrates a faucet plumbing fixture having a final ombré appearance according to an exemplary embodiment.

FIG. 4 illustrates one example of a faucet plumbing fixture having a final ombré appearance whereby a first coating is positioned toward a first end of the faucet, a second coating is positioned toward a second end of the faucet, and a transition region is positioned therebetween.

In one embodiment, the removing step includes a chemical separation process, whereby after the third step 300 of masking a portion of the plumbing fixture and the fourth step 400 of depositing the second coating atop both the protected portion coated with the masking material and the unprotected portion coated by only the first coating, the sacrificial mask material is washed out together with overlying portions of the second coating to leave exposed portions of the first coating that was protected by the mask. Selection of chemical solvents are evaluated for selective removal of the mask material. In other words, solvents must be chosen to selectively disengage the masking material from the first coating without substantially attacking either the first coating or the second coating.

In one exemplary embodiment, where boron nitride was used as the mask material, an acid wash was conducted comprising water and a mixture of acids such as sulfuric acid ($H_2SO_4$) and hydrofluorosilicic (HFC) acid. Other acids which may be included in the mixture include mineral acids (e.g., nitric acid ($HNO_3$), hydrochloric acid (HCl), hydrofluoric acid (HF), and phosphoric acid ($H_3PO_4$)) and organic acids (acetic acid ($CH_3COOH$) and formic acid ($CH_2O_2$)). The acid components of the acid wash facilitate removal of boron nitride by affecting the residual suspension binder (e.g., bentonite, alumina bentonite, or alumina) phases or by slightly dissolving the substrate enough to get the boron nitride layer to release. The pH of the acid wash solution may be in a range of 1 to 5. One example of a contemplated acid wash is an aqueous solution comprising a mixture of 3.5% concentrated sulfuric acid and a 23% hydrofluorosilicic acid solution at about 40° C. In another exemplary embodiment, water-based or organic solvent-based boron nitride coatings may be removed by exposure to water or solvent (e.g., ethanol, acetone, or combinations thereof), respectively.

In yet another exemplary embodiment, masking materials may also be removed using frictional mechanical techniques such as light sandpapering, wire-brushing, grit-blasting or shot-blasting, $CO_2$ (dry ice) blasting, or ultrasonic-cleaning baths. Although the present application discusses examples in which the surface transitions from one coating to another, it is possible that additional transitions may be provided according to other exemplary embodiments (e.g., three or more colors may be used, with a graduated transition between each using similar masking and deposition processes as described herein).

Figure 6:
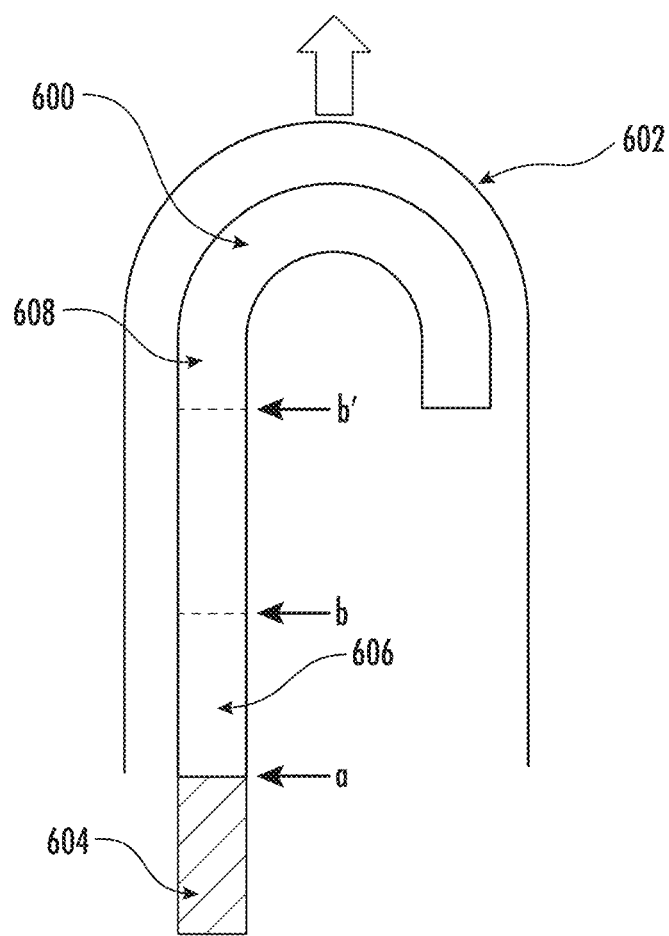
FIG. 6 illustrates a mask-less configuration for depositing a coating in a vacuum chamber, according to another exemplary embodiment.

In another embodiment, the ombré appearance may also be achieved without the masking material as described herein. For example, it is contemplated that the gradient of the second coating is positioned on the first coating without having to remove the plumbing fixture from the vacuum chamber after deposition of the first coating. As shown in FIG. 6, plumbing fixture 600 remains in the vacuum chamber after deposition of the first coating and is partially covered with a shroud 602 such that a first portion 604 is completely exposed to the vacuum environment for deposition of the second coating. First portion 604 (i.e., below line a) will experience substantially complete (i.e., about 100%) coverage with the second coating. After coating of the first portion 604 is complete the shroud 602 is gradually and continuously shifted upwards till some amount of the second coating reaches a predetermined position b along the plumbing fixture 600. The section of the plumbing fixture between a and b represents the transition region 606 (e.g., see also FIG. 1) where there is a gradual transition from the second coating to the first coating. Position b' represents the maximum height along the plumbing fixture to which the shroud 602 may be shifted and is along the same horizontal plane as the portion 608 of the fixture comprising substantially complete (i.e., about 100%) coverage with the first coating. In other words, above position b (and therefore b'), the fixture comprises substantially no (i.e., about 0%) coverage with the second coating (and about 100% coverage with the first coating). The shroud may be shifted at a constant or varying linear speed, with the shift rate dependent on the desired pattern of the ombré appearance. In some exemplary embodiments, the fixture may be rotated within the vacuum chamber during deposition.

In yet another embodiment, the ombré appearance may also be achieved without the masking material as described herein. For example, it is contemplated that the ombré appearance may be applied using a single, continuous PVD process whereby a first flow of material comprising a first coating gradually transitions to a second flow of material comprising a second coating as a shroud is gradually shifted across a dimension of the plumbing fixture. Much like the embodiment of FIG. 6, the shroud may be shifted at a constant or varying linear speed, with the shift rate dependent on the desired pattern of the ombré appearance. In some exemplary embodiments, the fixture may be rotated within the vacuum chamber during deposition.

Figure 7:
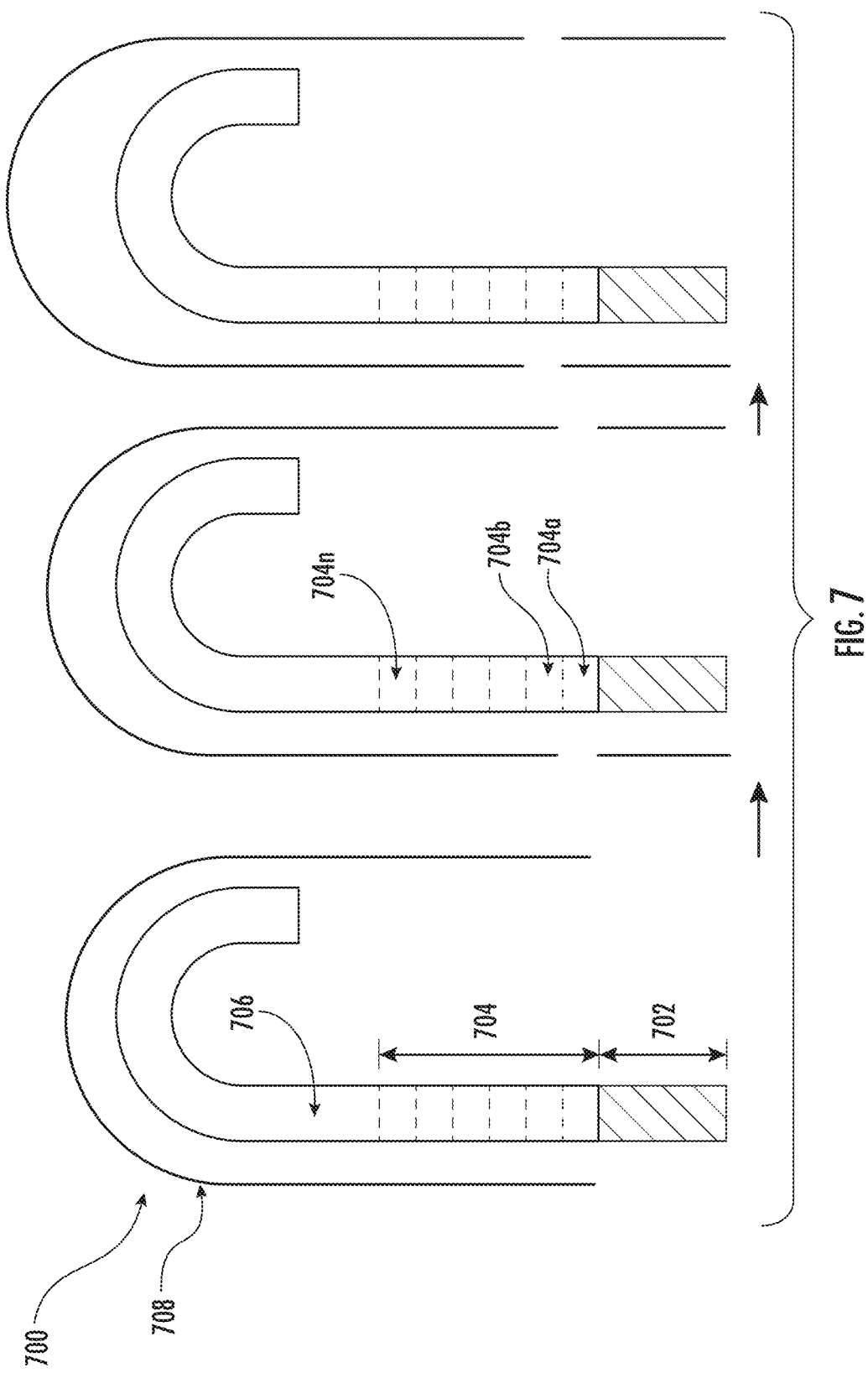
FIG. 7 illustrates a mask-less configuration for depositing a coating in a vacuum chamber, according to another exemplary embodiment.

FIG. 7 illustrates one exemplary embodiment of the single, continuous PVD process, whereby a fixture 700 is placed inside a PVD chamber and shrouded 708 to expose only a first portion 702 of the fixture 700 where substantially complete coverage of the first coating is desired. The first flow of material comprising the first coating enters the chamber and the exposed first portion 702 is coated (i.e., about 100%) with the first coating. Upon completion of coating the first portion 702, the first portion 702 is shrouded and at the same time, the first flow is gradually decreased while the second flow of material comprising the second coating is gradually increased. In other words, a second portion 704 which is the transition segment and positioned adjacent to the first portion 702 is exposed to the dual first and second flow. For example, the second portion 704 may be divided into a predetermined number of regions, with each subsequent region being positioned gradually away from the first portion 702 (e.g., first region 704a adjacent to first portion 702, second region 704b adjacent to first region 704a and separated from first portion 702 by first region 704a, third region adjacent to second region and separated from first portion by first and second regions, etc.). In the coating process of the second portion 704, only the first region 704a of the second portion 704 is exposed to the dual flow, which would comprise mostly the first material and a trace amount of second material. After the first region 704a is coated, the first region 704a is shrouded and the second region 704b is exposed to the dual flow, this time with a decreased amount of first material and an increased amount of second material as in the first region 704a. This process continues until the last region 704n of the second portion 704 experiences a dual flow comprising mostly the second material and a trace amount of first material. After the second portion 704 (i.e., the transition segment) is complete, both the first portion 702 and the second portion 704 are shrouded and a third portion 706 of the fixture, where substantially complete coverage of the second coating is desired, is exposed to the second flow of material comprising the second coating to achieve substantially complete coverage (i.e., about 100%) with the second coating.

The present disclosure describes a novel method for forming a multicolor finish. Benefits of the fabrication methods described herein include forming a dual-coated, graded appearance having a transition region (from the first appearance coating to the second appearance coating) without any apparent cloudiness or diffused finish distortion or transition region defects. Moreover, the use of PVD deposition in forming the first and second coatings results in robust, long-lasting finishes at mostly any desired purity to achieve predetermined aesthetic standards for the plumbing fixture.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

The construction and arrangement of the elements of the multi-colored finishes for plumbing fixtures and methods of fabrication thereof as shown in the exemplary embodiments are illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements, the position of elements may be reversed or otherwise varied, and the nature or number of discrete elements or positions may be altered or varied.

Additionally, the word "exemplary" is used to mean serving as an example, instance, or illustration. Any embodiment or design described herein as "exemplary" is not necessarily to be construed as preferred or advantageous over other embodiments or designs (and such term is not intended to connote that such embodiments are necessarily extraordinary or superlative examples). Rather, use of the word "exemplary" is intended to present concepts in a concrete manner. Accordingly, all such modifications are intended to be included within the scope of the present disclosure. Other substitutions, modifications, changes, and omissions may be made in the design, operating conditions, and arrangement of the preferred and other exemplary embodiments without departing from the scope of the appended claims.

Other substitutions, modifications, changes and omissions may also be made in the design, operating conditions and arrangement of the various exemplary embodiments without departing from the scope of the present invention. For example, any element disclosed in one embodiment may be incorporated or utilized with any other embodiment disclosed herein. Also, for example, the order or sequence of any process or method steps may be varied or re-sequenced according to alternative embodiments. Any means-plus-function clause is intended to cover the structures described herein as performing the recited function and not only structural equivalents but also equivalent structures. Other substitutions, modifications, changes and omissions may be made in the design, operating configuration, and arrangement of the preferred and other exemplary embodiments without departing from the scope of the appended claims.

While this specification contains many specific exemplary embodiment details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. In some cases, the actions recited herein can be performed in a different order and still achieve desirable results. In addition, the processes depicted in the accompanying figures do not necessarily require the particular order shown, or sequential order, to achieve desirable results. In certain exemplary embodiments, multitasking and parallel processing may be advantageous.

What is claimed is:

1. A method of applying a multi-color finish to a plumbing fixture comprising:
   depositing a first coating on the plumbing fixture;
   selectively applying a masking material in a graduated fashion over at least a portion of the first coating to define a gradient from a first portion of the plumbing fixture that is substantially completely covered by the masking material to a second portion of the plumbing fixture that has substantially no masking material;
   depositing a second coating over the masking material; and
   removing the masking material from the plumbing fixture such that the plumbing fixture has a surface finish including a transition region representing a gradual transition between the first coating and the second coating;
   wherein selectively applying the masking material in a graduated fashion comprises spraying the masking material at varying intensities along different angles relative to the plumbing fixture.

2. The method according to claim 1, wherein the transition region includes a first percentage of the first coating and a second percentage of the second coating.

3. The method according to claim 2, wherein the first percentage is in a range of about 5% to about 95% with the remaining balance as the second percentage.

4. The method according to claim 1, wherein the transition region includes a plurality of percentages of the first coating and a plurality of percentages of the second coating.

5. The method according to claim 1, wherein the first coating defines a first finish having a first appearance, and wherein the second coating defines a second finish having a second appearance that is different from the first appearance.

6. The method according to claim 5, wherein the first finish and the second finish are selected from at least one of polished chrome, brushed chrome, polished French gold, polished titanium, brushed titanium, polished rose gold, polished modern gold, polished tungsten, polished modern brass, satin titanium, polished satin chrome, satin bronze, polished brass, satin brass, oil-rubbed bronze, polished nickel, brushed nickel, or matte black.

7. The method according to claim 1, wherein the step of depositing the first coating and the step of depositing the second coating are conducted using at least one of physical vapor deposition (PVD), chemical vapor deposition (CVD), atomic layer deposition (ALD), electroplating, dip coating, or spray coating.

8. The method according to claim 7, wherein the step of depositing the first coating and the step of depositing the second coating are each conducted using physical vapor deposition (PVD), and wherein the PVD is conducted as the plumbing fixture is rotated on a turntable.

9. The method according to claim 8, wherein the PVD is selected from at least one of cathodic-arc evaporation, sputter deposition, or high-impulse power magnetron sputtering (HIPIMS).

10. The method according to claim 1, wherein the masking material includes at least one of molybdenum disulfide, tungsten disulfide, boron nitride, or graphite.

11. The method according to claim 10, wherein after the step of masking, the masking material is cured at a temperature in a range of about 60° C. to about 250° C. for a time in a range of about 15 minutes to about 120 minutes.

12. The method according to claim 1, wherein the masking material is applied by spraying, and wherein the spraying is conducted as the plumbing fixture is rotated on a turntable.

13. The method according to claim 1, wherein the step of depositing the second coating comprises depositing the second coating on the first portion and the second portion.

14. The method according to claim 1, wherein the step of removing the masking material comprises washing the plumbing fixture using at least one of a water-based wash, an acid wash, or an organic solvent-based wash.

15. The method according to claim 1, wherein the step of depositing the first coating on the plumbing fixture includes depositing the first coating on the entire surface area of the plumbing fixture.

16. The method according to claim 1, wherein the step of depositing the first coating on the plumbing fixture includes depositing the first coating on only a portion of the surface area of the plumbing fixture.

17. The method according to claim 1, wherein the masking material is a dry lubricant.

18. The method according to claim 1, further comprising depositing a primer layer on the plumbing fixture prior to depositing the first coating.

19. The method according to claim 1, wherein the plumbing fixture is a faucet.

\* \* \* \* \*